(12) United States Patent
Wakatsuki et al.

(10) Patent No.: US 9,613,872 B2
(45) Date of Patent: Apr. 4, 2017

(54) METHOD OF MANUFACTURING SEMICONDUCTOR DEVICE

(71) Applicant: KABUSHIKI KAISHA TOSHIBA, Tokyo (JP)

(72) Inventors: Satoshi Wakatsuki, Mie (JP); Masayuki Kitamura, Mie (JP); Atsuko Sakata, Mie (JP); Kyoichi Suguro, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/638,443

(22) Filed: Mar. 4, 2015

(65) Prior Publication Data

US 2016/0093538 A1 Mar. 31, 2016

(30) Foreign Application Priority Data

Sep. 29, 2014 (JP) .................. 2014-198373

(51) Int. Cl.
*H01L 21/44* (2006.01)
*H01L 21/8238* (2006.01)
*H01L 21/288* (2006.01)
*H01L 21/285* (2006.01)
*H01L 29/45* (2006.01)
*H01L 21/768* (2006.01)
*H01L 29/167* (2006.01)

(52) U.S. Cl.
CPC .... *H01L 21/823814* (2013.01); *H01L 21/288* (2013.01); *H01L 21/28518* (2013.01); *H01L 21/28568* (2013.01); *H01L 21/76843* (2013.01); *H01L 21/76855* (2013.01); *H01L 21/823871* (2013.01); *H01L 29/456* (2013.01); *H01L 21/28556* (2013.01); *H01L 29/167* (2013.01)

(58) Field of Classification Search
USPC ......................................... 438/660
See application file for complete search history.

(56) References Cited

U.S. PATENT DOCUMENTS

| | | | |
|---|---|---|---|
| 6,232,227 B1 | 5/2001 | Mikagi | |
| 6,566,254 B1 | 5/2003 | Mikagi | |
| 2011/0031622 A1 | 2/2011 | Honda et al. | |
| 2015/0243565 A1* | 8/2015 | Nieh | H01L 21/823871 257/369 |

FOREIGN PATENT DOCUMENTS

| | | |
|---|---|---|
| JP | 2-126636 | 5/1990 |
| JP | 2011-208227 | 10/2011 |

* cited by examiner

*Primary Examiner* — Timor Karimy
(74) *Attorney, Agent, or Firm* — Finnegan, Henderson, Farabow, Garrett & Dunner LLP

(57) ABSTRACT

A method of manufacturing a semiconductor device includes forming a first metal containing a first conductivity-type impurity above a substrate provided with a first conductivity-type impurity region containing the first conductivity-type impurity and a second conductivity-type impurity region containing a second conductivity-type impurity; and forming a metal silicide containing the first metal by selectively causing, by thermal treatment, a reaction between the first metal and silicon contained in the substrate in the first conductivity-type impurity region.

20 Claims, 5 Drawing Sheets

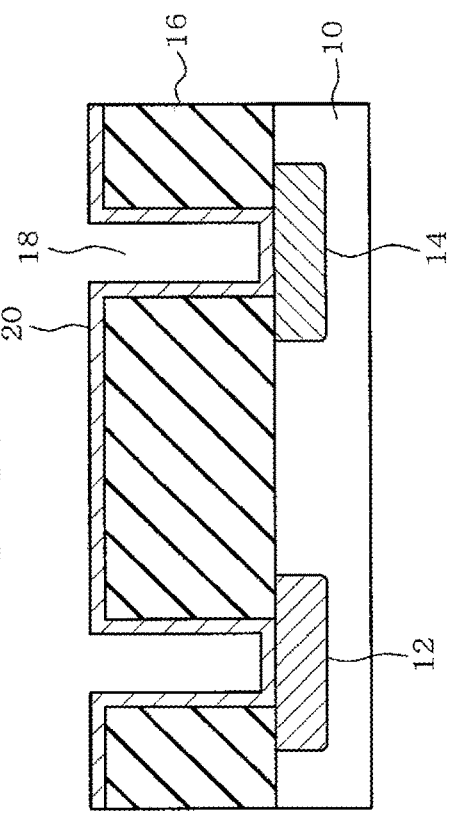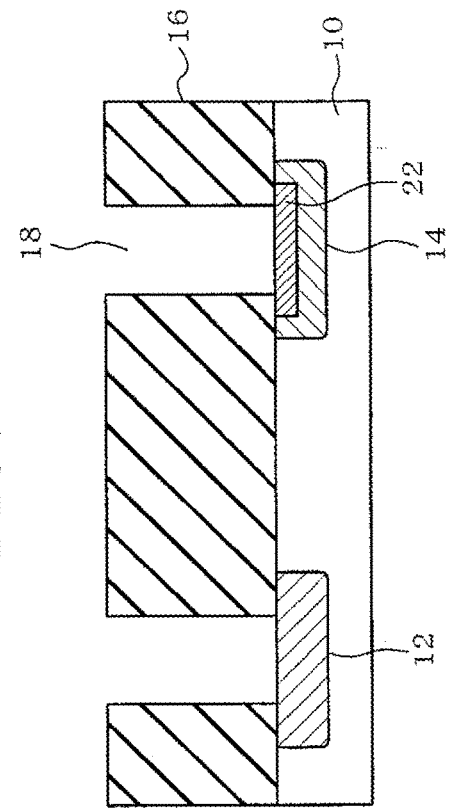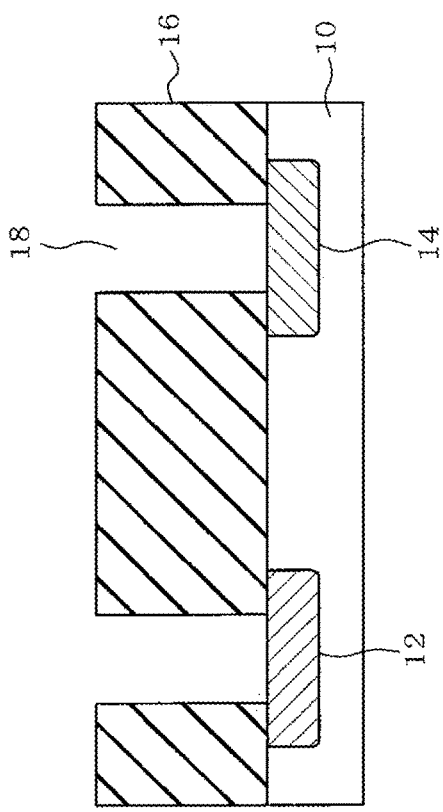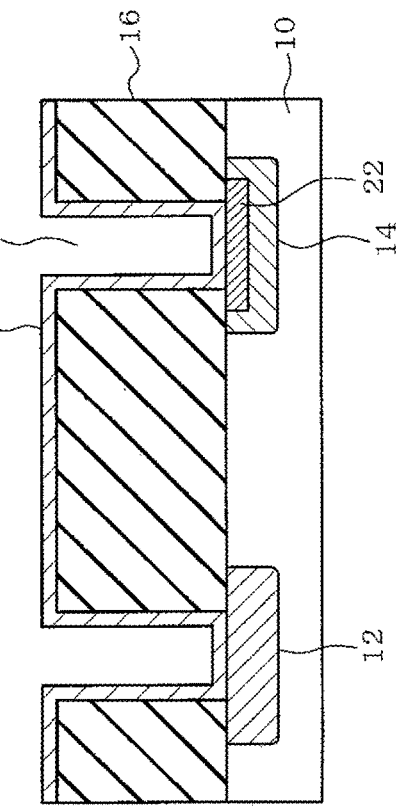

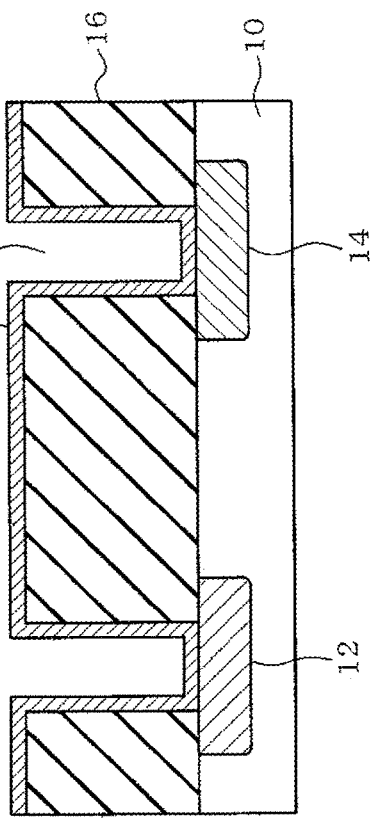
FIG. 3A
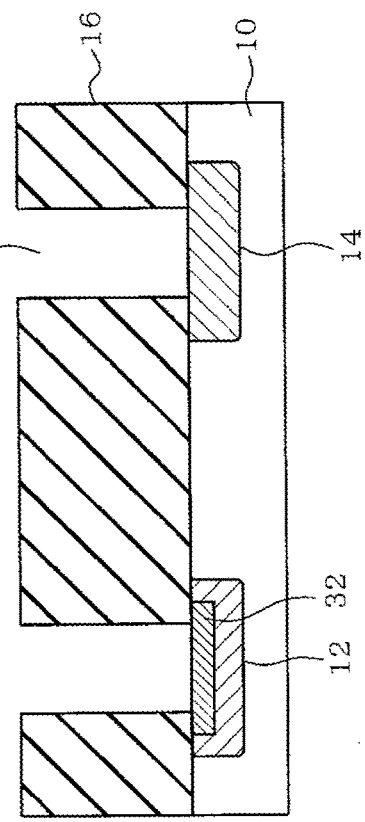
FIG. 3B
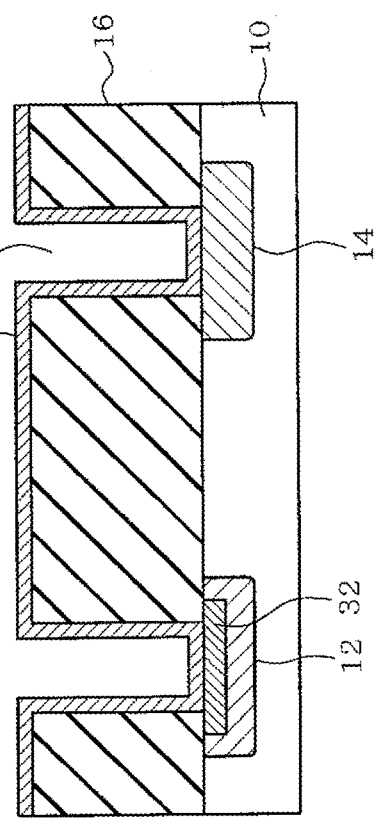
FIG. 3C
FIG. 3D

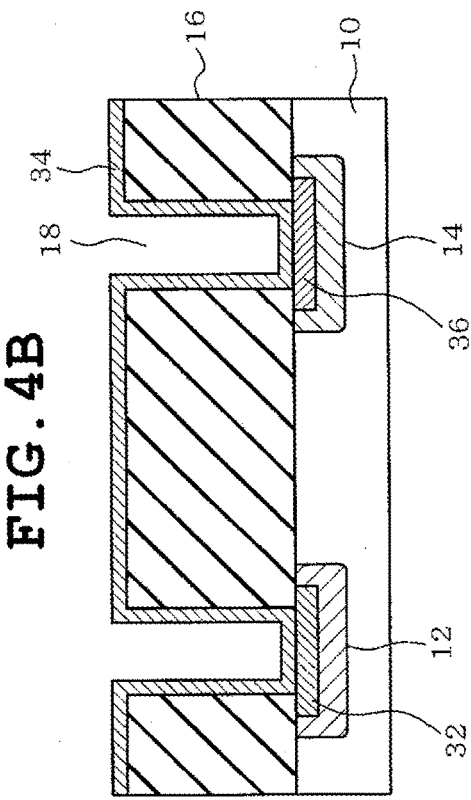
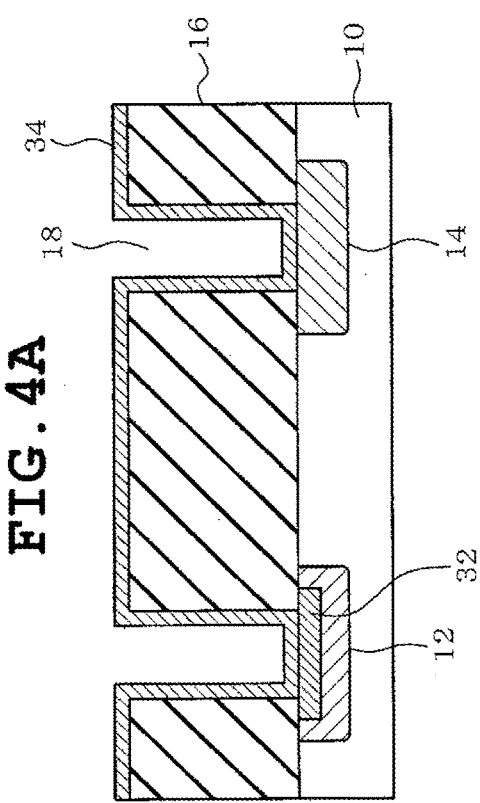
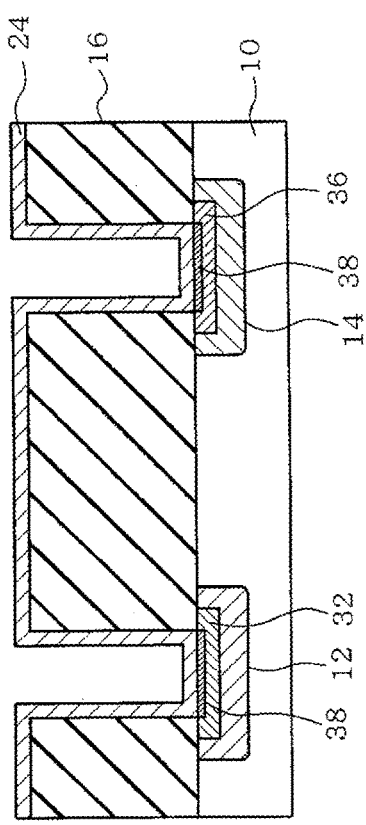
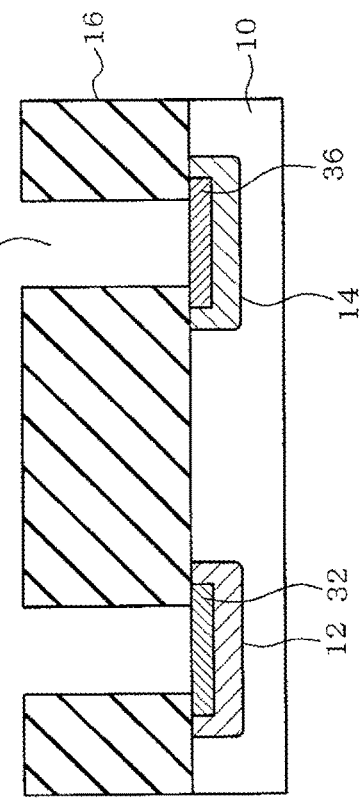

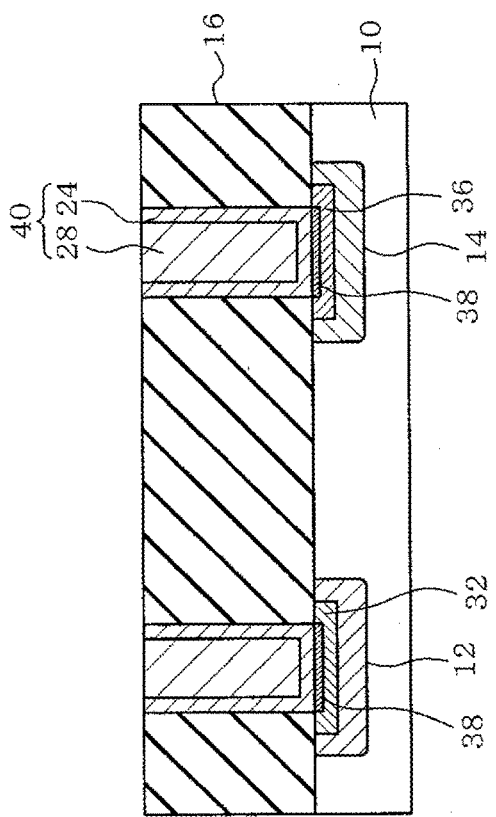
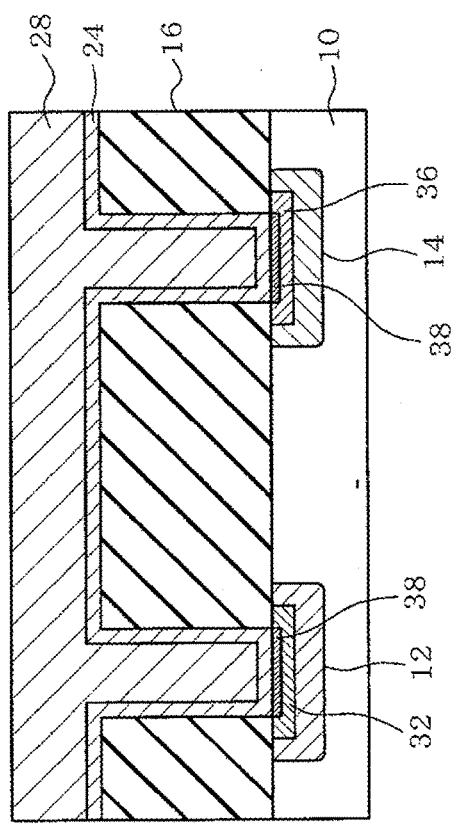

METHOD OF MANUFACTURING SEMICONDUCTOR DEVICE

CROSS-REFERENCE TO RELATED APPLICATION(S)

This application is based upon and claims the benefit of priority from Japanese Patent Application No. 2014-198373, filed on, Sep. 29, 2014 the entire contents of which are incorporated herein by reference.

FIELD

Embodiments disclosed herein generally relate to a method of manufacturing a semiconductor device.

BACKGROUND

In manufacturing a semiconductor device having a p-type impurity region and an n-type impurity region in a semiconductor substrate, a metal silicide may be provided in the impurity regions to form low-resistance contacts. A metal material having an appropriate barrier height is used for each type of impurity region. However, forming the contacts with different materials complicates and increases the cost of the manufacturing process.

BRIEF DESCRIPTION OF THE DRAWINGS

FIGS. 1A to 1D illustrate a method of manufacturing a semiconductor device of a first embodiment and are each one example a vertical cross sectional view of the semiconductor device in one phase of the manufacturing process flow.

FIGS. 3A to 3D illustrate a method of manufacturing a semiconductor device of a second embodiment and are each one example a vertical cross sectional view of the semiconductor device in one phase of the manufacturing process flow.

FIGS. 4A to 4D illustrate the method of manufacturing the semiconductor device of the second embodiment and are each one example a vertical cross sectional view of the semiconductor device in one phase of the manufacturing process flow.

FIGS. 5A and 5B illustrate the method of manufacturing the semiconductor device of the second embodiment and are each one example a vertical cross sectional view of the semiconductor device in one phase of the manufacturing process flow.

DESCRIPTION

Figure 2A:
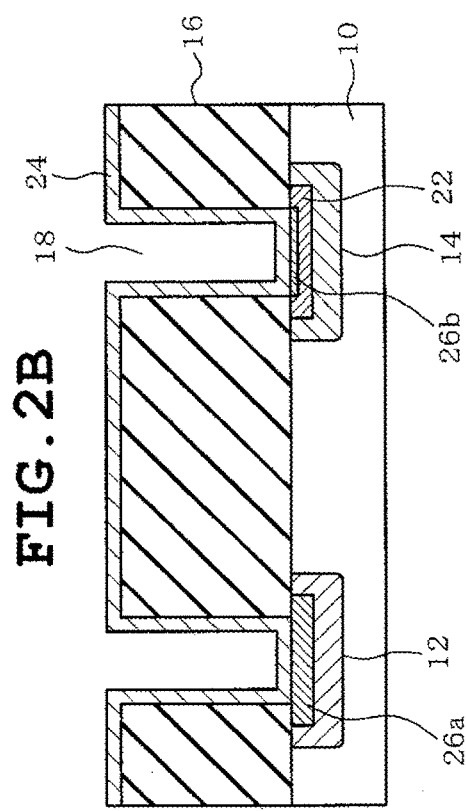
FIGS. 2A to 2D illustrate the method of manufacturing the semiconductor device of the first embodiment and are each one example a vertical cross sectional view of the semiconductor device in one phase of the manufacturing process flow.

In one embodiment, a method of manufacturing a semiconductor device includes forming a first metal containing a first conductivity-type impurity above a substrate provided with a first conductivity-type impurity region containing the first conductivity-type impurity and a second conductivity-type impurity region containing a second conductivity-type impurity; and forming a metal silicide containing the first metal by selectively causing, by thermal treatment, a reaction between the first metal and silicon contained in the substrate in the first conductivity-type impurity region.

Embodiment

Embodiments are described herein with reference to the accompanying drawings. The drawings are schematic and are not necessarily consistent with the actual relation between thickness and planar dimensions as well as the ratio of thicknesses between different layers, etc. The same element may be represented in different dimensions or ratios depending upon the Figures. Further, directional terms such as up, down, left, and right are used in a relative context with an assumption that the surface, on which circuitry is formed, of the later described semiconductor substrate faces up and thus, do not necessarily correspond to the directions based on gravitational acceleration.

In the drawings referred to in the following description, elements that are identical or similar to those already illustrated are identified with identical or similar reference symbols and may not be re-described in detail.

First Embodiment

A first embodiment is described hereinafter with reference to the drawings. The vertical cross-sectional views provided in FIGS. 1A to 1D and FIGS. 2A to 2D illustrate one example of a process flow for manufacturing a semiconductor device and each illustrate one phase of the manufacturing process flow.

Referring to FIG. 1A, n-type impurity region 12 and p-type impurity region 14 are formed in semiconductor substrate 10. Lithography and implantation techniques may be used for example in forming n-type impurity region 12 and p-type impurity region 14. Phosphorous (P) is one example of impurities being introduced into n-type impurity region 12. Arsenic (As) may also be introduced into n-type impurity region 12 in addition to phosphorous. Boron (B) is one example of impurities being introduced into p-type impurity region 14. For example, in a MOS (Metal Oxide Semiconductor) transistor application, n-type impurity region 12 may serve as the source•drain region of an n-type MOS transistor and p-type impurity region 14 may serve as the source•drain region of a p-type MOS transistor.

Next, insulating film 16 is formed above semiconductor substrate 10. A silicon oxide film may be used for example as insulating film 16. The silicon oxide film may be formed for example by CVD (Chemical Vapor Deposition). Then, holes 18 are formed into insulating film 16 by lithography and RIE (Reactive Ion Etching) for example. Holes 18 are formed through insulating film 16 so as to extend from the upper surface of insulating film 16 to the surfaces of n-type impurity region 12 and p-type impurity region 14. The upper surfaces of n-type impurity region 12 and p-type impurity region 14 are exposed at the bottom portions of holes 18.

Next, first metal film 20 is formed as illustrated in FIG. 1B. First metal film 20 may be formed for example by electroless plating. It is thus, possible to form first metal film 20 conformally along the surface of insulating film 16 and along the inner sides of holes 18. First metal film 20 contacts the upper surfaces of n-type impurity region 12 and p-type impurity region 14 at the bottom portions of holes 18.

First metal film 20 may comprise a film of metal such as nickel (Ni), cobalt (Co), palladium (Pd), iridium (Ir), platinum (Pt), ruthenium (Ru), rhenium (Re), or gold (Au) that contains boron. Further, it is possible to form NiMo or CoW for example by mixing tungstic acid ions or molybdic acid ions into the electroless plating liquid. The first embodiment is described through an example in which nickel is used as the metal material of first metal film 20.

Alkyl amine borane may be used for example as a reductant of electroless plating liquid used in forming first metal film 20. One example of alkyl amine borane may be dimethyl amine borane. It is thus, possible to form first metal film 20 containing boron which is, in this example, nickel boron (NiB). The use of cobalt, NiMo, or CoW instead of nickel used in the above described example results in, cobalt boron (CoB), NiMoB, or CoWB, respectively.

It is possible to control the amount of boron contained in first metal film 20 by varying the conditions of electroless plating liquid such as temperature, pH, metal ion concentration, concentration and/or type complexing agent, the concentration of reductant, etc. The amount of boron contained in first metal film 20 may be thus, controlled to range from 0.01 at % to 30 at %. In this example, $1 \times 10^{22}$ atm/cm$^3$ of boron is contained in first metal film 20.

CVD may be used instead of the above described electroless plating in forming first metal film 20. When employing CVD, it is possible to introduce boron into first metal film 20 by supplying diborane ($B_2H_6$) gas into the deposition atmosphere. Further, it is possible to control the amount of boron contained in first metal film 20 by controlling the conditions of film formation such as the temperature, pressure, and the flow rate of diborane gas. It is further possible to form first metal film 20 by sputtering. It is possible to introduce boron into first metal film 20 by sputtering a target containing boron.

Referring now to FIG. 1C, metal silicide 22 is formed by the reaction of semiconductor substrate 10 (silicon) with first metal film 20 (nickel). The reaction may be caused for example by a thermal treatment carried out in an argon (Ar) atmosphere of approximately 300 degrees Celsius to 900 degrees Celsius. In this example, nickel silicide (NiSi) is formed as metal silicide 22.

In this example, metal silicide 22, containing the metal material of first metal film 20, is formed near the boundary of first metal film 20 and p-type impurity region 14. In contrast, metal silicide 22 is not formed at the boundary of first metal film 20 and n-type impurity region 12. In other words, it is possible to selectively form metal silicide 22 in p-type impurity region 14. It is believed that the formation of a metal silicide in n-type impurity region 12 is inhibited by the reaction of boron serving as a p-type impurity contained in first metal film 20 and phosphorous serving as an n-type impurity contained in n-type impurity region 12.

Referring now to FIG. 1D, unreacted first metal film 20 formed along the upper surface of insulating film 16, the sidewalls of holes 18, n-type impurity region 12, and p-type impurity region 14 is removed by SPM (Sulfuric Peroxide Mixture). Metal silicide 22 is selectively formed in p-type impurity region 14 and not in n-type impurity region 12 as the result of the above described process flow.

Next, second metal film 24 is formed as illustrated in FIG. 2A. A stack of titanium (Ti) and titanium nitride (TiN) films may be used for example as second metal film 24. The titanium and titanium nitride films may be formed for example by CVD. The titanium nitride film serves as an adhesion layer for facilitating adhesion with metal which is, in this case, tungsten formed later in the process flow.

Figure 2C:
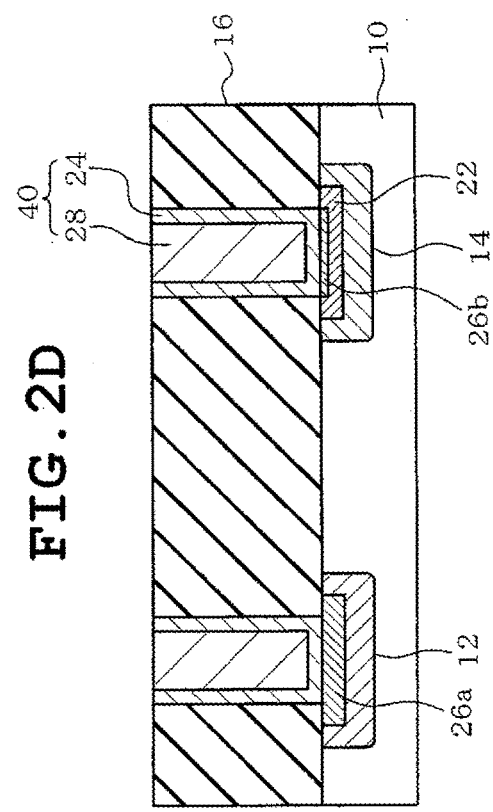
Figure 2B:
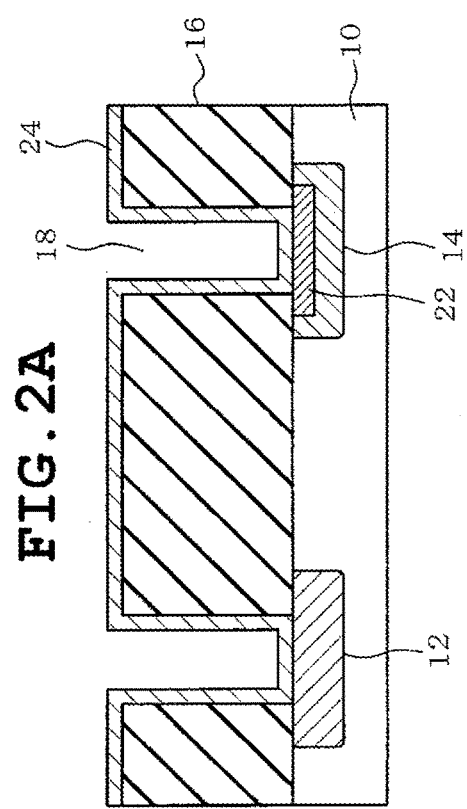

Next, as illustrated in FIG. 2B, metal silicide 26 (26a and 26b) is formed in n-type impurity region 12 and p-type impurity region 14 by thermal treatment. In this example, a titanium silicide (TiSi) is formed as the result of reaction second metal film 24 with silicon of semiconductor substrate 10 (n-type impurity region 12 and p-type impurity region 14).

In case CVD formation of titanium serving as second metal film 24 is carried out in a temperature of 500 degrees Celsius or greater, the metal silicidation progresses during the formation of titanium to obtain a titanium silicide. Thus, the thermal treatment described with reference to FIG. 2B may take place during the formation of titanium serving as second metal film 24.

When a metal silicide is disposed at the boundaries of contacts and n-type impurity region 12 and p-type impurity region 14 located in semiconductor substrate 10, the barrier heights of the contacts are preferably reduced from the stand point of reducing the contact resistance. Thus, appropriate metal material is selected for formation of the metal silicide.

When forming a metal silicide in p-type impurity region 14 (p+ region), a metal is used in which the work function of the metal alone is approximately 5.1 ev which is the upper end of the valence band of silicon. Thus, examples of metal which are appropriate for serving as metal silicide formed in p-type impurity region 14 include nickel (Ni), cobalt (Co), palladium (Pd), iridium (Ir), platinum (Pt), ruthenium (Ru), rhenium (Re), gold (Au), and the like which have work function approximating 5.1 ev.

In contrast, when forming a metal silicide in n-type impurity region 12 (n+ region), a metal is used in which the work function of the metal alone is approximately 4.1 ev which is the lower end of the valence band of silicon. Thus, examples of metal which are appropriate for serving as metal silicide formed in n-type impurity region 12 include titanium (Ti), vanadium (V), zirconium (Zr), niobium (Nb), hafnium (Hf), tantalum (Ta), scandium (Sc), yttrium (Y), lanthanum (La), holmium (Ho), samarium (Sm), ytterbium (Yb), erbium (Er), and the like which have work function approximating 4.1 ev.

In the first embodiment, a nickel silicide is formed in p-type impurity region 14 whereas a titanium silicide is formed in n-type impurity region 12.

A titanium silicide serving as metal silicide 26b is also formed in p-type impurity region 14. However, the contact resistance can be reduced since it is the nickel silicide serving as metal silicide 22 which contacts silicon of p-type impurity region 14.

Referring next to FIG. 2C, metal film 28 is formed along the surface of second metal film 24. For example, tungsten (W) formed by CVD may be used as metal film 28.

Figure 2D:
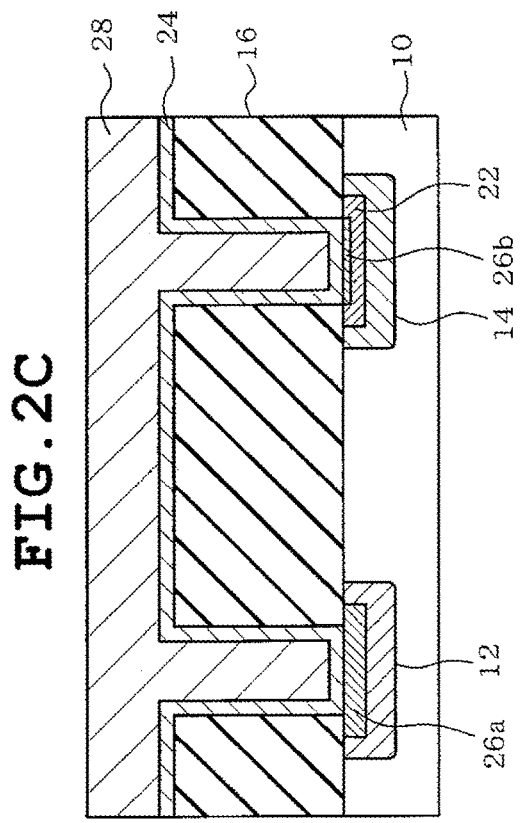

Referring next to FIG. 2D, metal film 28 and second metal film 24 are polished by CMP (Chemical Mechanical Polishing) until the upper surface of insulating film 16 is exposed. Contact plugs 40 including second metal film 24 and metal film 28 is thus, obtained.

The bottom portion of contact plug 40 contacts metal silicide 26a (titanium silicide) in n-type impurity region 12 but does not contact n-type impurity region 12. Metal silicide 26a contacts n-type impurity region 12. It is possible to reduce the contact resistance since n-type impurity region 12 contacts the titanium silicide serving as a metal silicide having a work function approximating 4.1 ev at the boundary of contact plug 40 and n-type impurity region 12.

The bottom portion of contact plug 40 contacts the upper surface of metal silicide 26b (titanium silicide) in p-type impurity region 14. The bottom portion of metal silicide 26b contacts metal silicide 22 (nickel silicide) but does not contact p-type impurity region 14. The bottom portion of metal silicide 22 contacts p-type impurity region 14. It is possible to reduce the contact resistance since p-type impurity region 14 contacts the nickel silicide serving as a metal silicide having a work function approximating 5.1 ev at the boundary of contact plug 40 and p-type impurity region 14.

In the first embodiment described above, a metal film is formed which includes an impurity being identical to or at least having the same conductivity type as either of n-type impurity region 12 and p-type impurity region 14 and being different from or at least having a different conductivity type as the remaining other of n-type impurity region 12 and p-type impurity region 14. The metal film is thereafter thermally treated. As a result, it is possible to selectively form a metal silicide in one of the impurity regions containing the same conductivity type impurity. It is thus, possible to easily form a metal silicide having different materials in the upper portion of p-type impurity region 14 and n-type impurity region 12. More specifically, it is possible to selectively form a self-aligned metal silicide in either of n-type impurity region 12 and p-type impurity region 14 when forming contacts to n-type impurity region 12 and p-type impurity region 14. As a result, it is possible to form metal silicides formed of different metal materials without adding a dedicated lithography process.

The first embodiment enables formation of metal silicides having appropriate barrier heights in both n-type impurity region 12 and p-type impurity region 14. Thus, it is possible to reduce the contact resistance as well as the number of process steps and cost in semiconductor device manufacturing.

Second Embodiment

A second embodiment is described hereinafter with reference to the drawings.

The vertical cross-sectional views provided in FIGS. 3A to 3D, FIGS. 4A to 4D and FIGS. 5A and 5B illustrate one example of a process flow for manufacturing a semiconductor device and each illustrate one phase of the manufacturing process flow.

In the first embodiment, a metal silicide illustrated as metal silicide 22 is formed in p-type impurity region 14 prior to n-type impurity region 12. The second embodiment is described through an example in which a metal silicide illustrated as metal silicide 32 is formed in n-type impurity region 12 prior to p-type impurity region 14.

Referring first to FIG. 3A, n-type impurity region 12 and p-type impurity region 14 are formed in semiconductor substrate 10 and insulating film 16 having holes 18 extending therethrough is disposed above semiconductor substrate 10. The structures as well as the process steps for obtaining the same are identical to those described with reference to FIG. 1A.

Next, third metal film 30 is formed as illustrated in FIG. 3B. Third metal film 30 may be formed for example by CVD by applying conditions that allow conformal formation. It is thus, possible to form third metal film 30 along the surface of insulating film 16 and along the inner sides of holes 18. Third metal film 30 contacts the upper surfaces of n-type impurity region 12 and p-type impurity region 14 at the bottom portions of holes 18.

Third metal film 30 may comprise a film of metal such as Ti, V, Zr, Nb, Hf, Ta, Sc, Y, La, Ho, Sm, Yb, or Er that contains phosphorous. The second embodiment is described through an example in which titanium is used as the metal material of third metal film 30.

When employing CVD, it is possible to introduce phosphorous into third metal film 30 by supplying phosphine ($PH_3$) gas into the deposition atmosphere. Further, it is possible to control the amount of phosphorous contained in third metal film 30 by controlling the conditions of film formation such as the temperature, pressure, and the flow rate of phosphine gas.

It is further possible to form third metal film 30 by sputtering. It is possible to introduce phosphorous into third metal film 30 by sputtering a target containing phosphorous. When electroless plating is used in forming third metal film 30, hypophosphoric acid or hypophosphite may be used for example as a reductant of the plating liquid in order to introduce phosphorous into third metal film 30.

Referring now to FIG. 3C, metal silicide 32 is formed by the reaction of semiconductor substrate 10 (silicon) with third metal film 30 (titanium). Metal silicide 32 comprises a titanium silicide (TiSi) in this example. The reaction may be caused for example by a thermal treatment carried out in an argon (Ar) atmosphere of approximately 300 degrees Celsius to 900 degrees Celsius.

In this example, metal silicide 32 is formed near the interface of third metal film 30 and n-type impurity region 12. In contrast, a metal silicide is not formed at the boundary of third metal film 30 and p-type impurity region 14. In other words, it is possible to selectively form metal silicide 32 in n-type impurity region 12. It is believed that the formation of a metal silicide in p-type impurity region 14 is inhibited by the reaction of phosphorous serving as a n-type impurity contained in third metal film 30 and boron serving as a p-type impurity contained in p-type impurity region 14.

Referring now to FIG. 3D, unreacted third metal film 30 formed along the upper surface of insulating film 16, the sidewalls of holes 18, n-type impurity region 12, and p-type impurity region 14 is removed by SPM (Sulfuric Peroxide Mixture). Metal silicide 32 is selectively formed in n-type impurity region 12 and not in p-type impurity region 14 as the result of the above described process flow.

Next, fourth metal film 34 is formed as illustrated in FIG. 4A. Fourth metal film 34 may be formed for example by electroless plating. It is thus, possible to form fourth metal film 34 in a conformal manner. Fourth metal film 34 contacts metal silicide 32 in n-type impurity region 12 as well as p-type impurity region 14 at the bottom portions of holes 18. Fourth metal film 34 may comprise a film of metal such as Ni, Co, Pd, Ir, Pt, Ru, Re, or Au that contains boron. Further, it is possible to form NiMo or CoW for example by mixing tungstic acid ions or molybdic acid ions into the electroless plating liquid. The second embodiment is described through an example in which nickel is used as the metal material of fourth metal film 34.

Alkyl amine borane may be used for example as a reductant of electroless plating liquid used in forming fourth metal film 34. One example of alkyl amine borane may be dimethyl amine borane. It is thus, possible to form fourth metal film 34 containing boron which is, in this example, nickel boron (NiB). The use of cobalt, NiMo, or CoW instead of nickel used in the above described example results in, cobalt boron (CoB), NiMoB, or CoWB, respectively.

It is possible to control the amount of boron contained in fourth metal film 34 by varying the conditions of electroless plating liquid such as temperature, pH, metal ion concentration, concentration and/or type complexing agent, the concentration of reductant, etc. The amount of boron contained in fourth metal film 34 may be thus, controlled to range from 0.01 at % to 30 at % for example. In this example, $1 \times 10^{22}$ atm/cm$^3$ of boron is contained in fourth metal film 34.

CVD may be used instead of the above described electroless plating in forming fourth metal film 34. When employing CVD, it is possible to introduce boron into fourth metal film 34 by supplying diborane ($B_2H_6$) as into the deposition atmosphere. Further, it is possible to control the amount of boron contained in fourth metal film 34 by controlling the conditions of film formation such as the temperature, pressure, and the flow rate of diborane gas. It is further possible to form fourth metal film 34 by sputtering. It is possible to introduce boron into fourth metal film 34 by sputtering a target containing boron.

Referring now to FIG. 4B, metal silicide 36 is formed by the reaction of semiconductor substrate 10 (silicon) with fourth metal film 34 (nickel). The reaction may be caused for example by a thermal treatment carried out in an argon (Ar) atmosphere of approximately 300 degrees Celsius to 900 degrees Celsius. In this example, nickel silicide (NiSi) is formed as metal silicide 36.

As a result, metal silicide 36 is selectively formed in p-type impurity region 14. In this example, metal silicide 36 is not formed in n-type impurity region 12, i.e. in metal silicide 32. It is believed that the formation of a metal silicide in n-type impurity region 12 is inhibited by the reaction of boron serving as a p-type impurity contained in fourth metal film 34 and phosphorous serving as an n-type impurity contained in n-type impurity region 12 and metal silicide 32.

Referring now to FIG. 4C, unreacted fourth metal film 34 formed along the upper surface of insulating film 16, the sidewalls of holes 18, n-type impurity region 12, and p-type impurity region 14 is removed by SPM (Sulfuric Peroxide Mixture). Metal silicide 36 is selectively formed in p-type impurity region 14 and not in n-type impurity region 12 as the result of the above described process flow. Even if metal silicide 36 is formed in n-type impurity region 12 because of the small amount of n-type impurity content in metal silicide 32, it does not become an impediment in reducing the contact resistance since it is metal silicide 32 that contacts the silicon of n-type impurity region 12.

It is possible to selectively form metal silicide 36 (nickel silicide) in p-type impurity region 14 by the above described process flow. Further, it is possible to form different metal silicides, namely metal silicide 32 (titanium silicide) in n-type impurity region 12 and metal silicide 36 (nickel silicide) in p-type impurity region 14 without a lithography process.

Next, second metal film 24 is formed as illustrated in FIG. 4D which is followed by thermal treatment. A stack of titanium (Ti) and titanium nitride (TiN) films may be used for example as second metal film 24. The titanium and titanium nitride films may be formed for example by CVD. The titanium nitride film serves as an adhesion layer for facilitating adhesion with metal film 28 which is, in this case, tungsten formed later in the process flow. Next, metal silicide 38 is formed in metal silicide 32 of n-type impurity region 12 and in metal silicide 36 of p-type impurity region 14 by thermal treatment. In this example, a titanium silicide (TiSi) is formed as metal silicide 38.

As described above, metal silicide 38 (titanium silicide) is formed in p-type impurity region 14 as well. However, it is possible to reduce contact resistance since it is metal silicide 36 (nickel silicide) which contacts p-type impurity region 14.

Referring next to FIG. 5A, metal film 28 is formed along the surface of second metal film 24. For example, tungsten (W) formed by CVD may be used as metal film 28.

Referring next to FIG. 5B, metal film 28 and second metal film 24 are polished by CMP (Chemical Mechanical Polishing) until the upper surface of insulating film 16 is exposed. Contact plugs 40 including second metal film 24 and metal film 28 are thus, obtained.

Metal silicide 38 and metal silicide 32, both comprising a titanium silicide in this example, are formed at the bottom portion of contact plug 40 in n-type impurity region 12. Metal silicide 32 contacts n-type impurity region 12. It is possible to reduce the contact resistance since n-type impurity region 12 contacts the titanium silicide serving as metal silicide 32 having a work function approximating 4.1 ev at the boundary of contact plug 40 and n-type impurity region 12.

Metal silicide 38, comprising titanium silicide in this example, is formed at the bottom portion of contact plug 40 in p-type impurity region 14. The bottom portion of metal silicide 38 contacts metal silicide 36 (nickel silicide) and the bottom portion of metal silicide 36 contacts p-type impurity region 14. It is possible to reduce the contact resistance since p-type impurity region 14 contacts the nickel silicide serving as metal silicide 36 having a work function approximating 5.1 ev at the boundary of contact plug 40 and p-type impurity region 14.

In the above described manufacturing method of a semiconductor device, it is possible to selectively form self-aligned metal silicides containing different metals in n-type impurity region 12 and p-type impurity region 14 when forming contacts to n-type impurity region 12 and to p-type impurity region 14. As a result, it is possible to form metal silicides having low barrier heights in n-type impurity region 12 and p-type impurity region 14. Therefore, it is possible to obtain effects similar to those of the first embodiment in the second embodiment as well.

Other Embodiments

The embodiments described above may be applied to various type of semiconductor devices including various types of storage devices such as a NAND type or a NOR type flash memory, EPROM, DRAM, and SRAM; and various type of logic devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
    forming a first metal containing a first conductivity-type impurity above a substrate provided with a first conductivity-type impurity region containing the first conductivity-type impurity and a second conductivity-type impurity region containing a second conductivity-type impurity; and
    forming a metal silicide containing the first metal by selectively causing, by thermal treatment, a reaction between the first metal and silicon contained in the substrate in the first conductivity-type impurity region.

2. The method according to claim 1, wherein the first conductivity-type impurity comprises either of boron and phosphorous and the second conductivity-type impurity comprises remaining other of boron and phosphorous.

3. The method according to claim 1, wherein the first conductivity-type impurity region is a p-type impurity region, the second conductivity-type impurity region is an n-type impurity region, and the first conductivity-type impurity comprises boron.

4. The method according to claim 3, wherein the first metal comprises nickel, cobalt, palladium, iridium, platinum, ruthenium, rhenium, or gold.

5. The method according to claim 4, wherein an amount of boron contained in the first metal ranges from 0.01 at % to 30 at %.

6. The method according to claim 4, wherein the first metal is formed by electroless plating.

7. The method according to claim 6, wherein the electroless plating employs a reductant comprising alkyl amine borane.

8. The method according to claim 4, wherein the first metal is formed by chemical vapor deposition.

9. The method according to claim 8, wherein diborane is introduced into a deposition atmosphere in the chemical vapor deposition.

10. The method according to claim 1, wherein the first conductivity-type impurity region is an n-type impurity region, the second conductivity-type impurity region is a p-type impurity region, and the first conductivity-type impurity comprises phosphorous.

11. The method according to claim 10, wherein the first metal comprises titanium, vanadium, zirconium, niobium, hafnium, tantalum, scandium, yttrium, lanthanum, holmium, samarium, ytterbium, or erbium.

12. The method according to claim 11, wherein the first metal is formed by chemical vapor deposition.

13. The method according to claim 12, wherein phosphine is introduced into a deposition atmosphere in the chemical vapor deposition.

14. The method according to claim 11, wherein the first metal is formed by electroless plating.

15. The method according to claim 14, wherein the electroless plating employs a reductant comprising hypophosphoric acid or hypophosphite.

16. The method according to claim 1, further comprising forming a second metal above the substrate provided with the first conductivity-type impurity region and the second conductivity-type impurity region; and forming, by thermal treatment, a metal silicide containing the second metal in the second conductivity-type impurity region and in the metal silicide formed in the first conductivity-type impurity region.

17. A method of manufacturing a semiconductor device comprising:

forming a first metal containing a first conductivity-type impurity above a substrate provided with a first conductivity-type impurity region containing the first conductivity-type impurity and a second conductivity-type impurity region containing a second conductivity-type impurity;

forming a metal silicide containing the first metal by selectively causing, by thermal treatment, a reaction between the first metal and silicon contained in the substrate in the first conductivity-type impurity region;

forming a second metal containing a second conductivity-type impurity above the substrate provided with the first conductivity-type impurity region and the second conductivity-type impurity region; and forming a metal silicide containing the second metal by selectively causing, by thermal treatment, a reaction between the second metal and silicon contained in the substrate in the second conductivity-type impurity region.

18. The method according to claim 17, wherein the first metal and the second metal are formed of different metal materials.

19. The method according to claim 18, further comprising forming a third metal above the substrate provided with the first conductivity-type impurity region and the second conductivity-type impurity region; and forming, by thermal treatment, a metal silicide containing the third metal in the metal silicide formed in the first conductivity-type impurity region and in the metal silicide formed in the second conductivity-type impurity region.

20. The method according to claim 18, wherein either of the first conductivity-type impurity region and the second conductivity-type impurity region serves as a source•drain region of an n-type metal-oxide-semiconductor transistor, and remaining other of the first conductivity-type impurity region and the second conductivity-type impurity region serves as a source•drain region of a p-type metal-oxide-semiconductor transistor.

* * * * *